(12) United States Patent
Herr et al.

(10) Patent No.: US 6,734,699 B1
(45) Date of Patent: May 11, 2004

(54) SELF-CLOCKED COMPLEMENTARY LOGIC

(75) Inventors: Quentin P. Herr, Torrance, CA (US); Arnold H. Silver, Rancho Palos Verdes, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 09/353,726

(22) Filed: Jul. 14, 1999

(51) Int. Cl.[7] .............................................. H03K 19/195
(52) U.S. Cl. ........................ 326/1; 326/3; 326/6; 326/7
(58) Field of Search ........................................... 326/1–7

(56) References Cited

U.S. PATENT DOCUMENTS

| | | | |
|---|---|---|---|
| 3,953,749 A | * 4/1976 | Baechtold et al. ............. | 326/4 |
| 4,092,553 A | 5/1978 | Fang et al. ..................... | 326/3 |
| 4,097,765 A | * 6/1978 | Zappe ............................ | 326/6 |
| 4,371,796 A | 2/1983 | Takada .......................... | 326/6 |
| 4,501,975 A | 2/1985 | Josephs et al. ................. | 326/3 |
| 4,623,804 A | 11/1986 | Goto ........................... | 365/162 |
| 4,672,244 A | * 6/1987 | Harada et al. ................. | 326/6 |
| 4,672,359 A | 6/1987 | Silver .......................... | 341/133 |
| 4,785,426 A | 11/1988 | Harada et al. ............... | 365/162 |
| 4,922,250 A | 5/1990 | Phillips et al. ................ | 341/13 |
| 5,051,627 A | * 9/1991 | Schneier et al. .............. | 326/4 |
| 5,135,908 A | 8/1992 | Yang et al. ..................... | 505/1 |
| 5,233,242 A | * 8/1993 | Murphy et al. ................ | 326/4 |
| 5,233,243 A | 8/1993 | Murphy et al. ................ | 326/4 |
| 5,233,244 A | * 8/1993 | Suzuki .......................... | 326/4 |
| 5,278,140 A | 1/1994 | Chaudhari et al. ............ | 505/1 |
| 5,411,937 A | 5/1995 | Wendt et al. ................ | 505/329 |
| 5,560,836 A | 10/1996 | Nagaishi ..................... | 505/329 |
| 5,598,105 A | * 1/1997 | Kurosawa et al. ............. | 326/6 |
| 5,892,243 A | 4/1999 | Chan ............................ | 257/31 |
| 5,982,219 A | * 11/1999 | Kirichenko ................. | 327/367 |

FOREIGN PATENT DOCUMENTS

| | | |
|---|---|---|
| EP | 435452 A3 | 11/1990 |
| EP | 435452 A2 | 11/1990 |
| JP | 57002129 | 7/1982 |

OTHER PUBLICATIONS

H. Hasegawa, et al.: A DC–Powered Josephson Logic Family That Uses Hybrid Unlatching Flip–Flop Logic Elemens (Huffles), Dec. 1995; IEEE Transactions on Applied Superconductivity, US, IEEE Inc., New York, vol 5, No. 4, pp. 3504–3510.

(List continued on next page.)

*Primary Examiner*—Trong Phan
(74) *Attorney, Agent, or Firm*—Katten Muchin Zavis Rosenman; John S. Paniaguas

(57) ABSTRACT

A superconducting self-clocked complementary SFQ logic family. The basic element of the circuit is a plurality of Josephson junctions and a control inductance coupled across a pair of voltage rails. An important aspect of the invention relates to the use of voltage biasing for the Josephson junctions, which provides several benefits. First, voltage biasing eliminates the need for biasing resistors as used in constant current mode devices. Such biasing resistors are known to be the dominant source of power dissipation in such logic circuits. Elimination of the biasing resistors thus reduce the power dissipation to the lowest possible value to that of the power dissipation of the switching devices themselves. In addition, the voltage biasing takes advantage of the voltage to frequency relationship of Josephson junctions and automatically establishes a global clock at the Josephson frequency without the need for extra circuitry; thus increasing the practical clock rate. In addition, elimination of extra clock circuitry increases the potential circuit density. The logic superconducting digital logic family in accordance with the present invention includes devices which perform logic functions such as, AND, OR etc. as well as non-logic functions, such as a shift register function.

11 Claims, 6 Drawing Sheets

OTHER PUBLICATIONS

P. F. Yuh et al.; "Josephson Edge–Triggered Gates for Sequential Circuits"; IEEE Transactions on applied Superconductivity, US, IEEE Inc., New York, vol 1, No. 1; Mar. 1, 1991; pp. 54–57.

M. Jeffery, et al; "Superconducting complementary Output Switching Logic Operating at 5–10 GB/S"; Applied Physics Letters, US, American Institute of Physics, New York, vol 69, No 18, Oct. 28, 1996; pp. 2746–2748.

K. K. Likharev, et al., "RSFQ Logic/Memory Family: A New Josephson–Junction Technology for Sub–Terahertz–Clock–Frequency Digital Systems," IEEE Trans. on Appl. Supercon., vol. 1, No. 1, Mar. 1991, pp. 3–28.

O. A. Mukhanov, et al., "New Elements of the RSFQ Logic Family," IEEE Trans. on Magn., vol. 27, No. 2, Mar. 1991, pp. 2435–2438.

S. V. Polonsky, et al., "New RSFQ Circuits," Applied Superconductivity Conf., Chicago, Aug. 1992, Report EM–6, 11pgs.

* cited by examiner

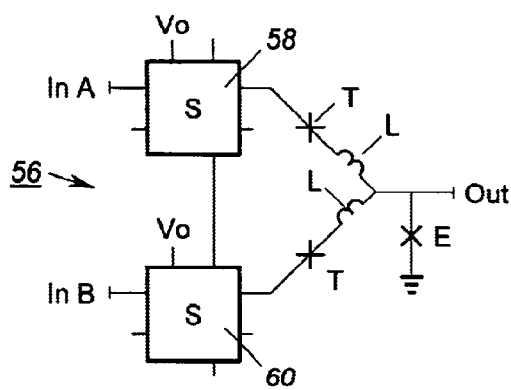
Figure 7a
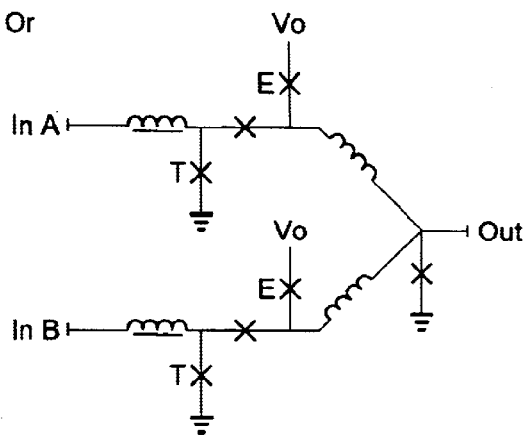
Figure 7b
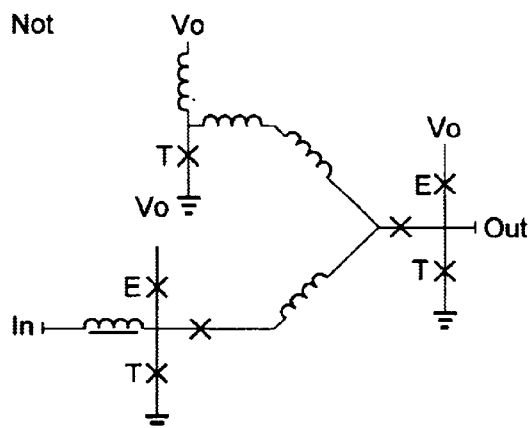
Figure 8a
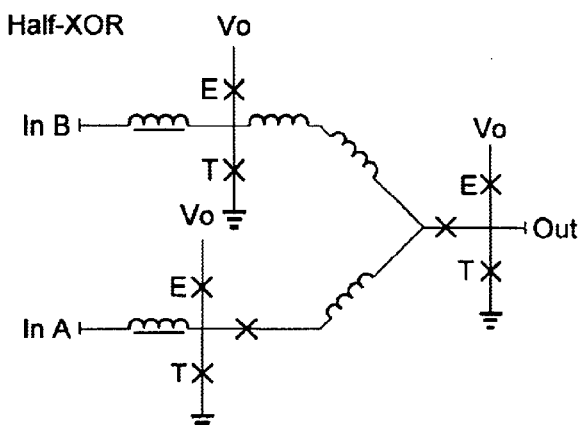
Figure 8b
Half-XOR Truth Table
| In A | In B | Out |
|---|---|---|
| 0 | 0 | 0 |
| 0 | 1 | 1 |
| 1 | 0 | 0 |
| 1 | 1 | 0 |
Figure 8c

SELF-CLOCKED COMPLEMENTARY LOGIC

BACKGROUND OF THE INVENTION

1. Field of the Invention

The present invention relates to a digital logic family and more particularly to a digital logic family formed from complementary series-connected pairs of Josephson junctions which are voltage biased to provide self-clocking as a result of the Josephson voltage to frequency relationship.

2. Description of the Prior Art

Superconducting circuit elements formed from Josephson junctions are known in the art. Examples of such circuits are disclosed in commonly owned U.S. Pat. Nos. 5,051,627, 4,672,359, and 4,922,250, as well as U.S. Pat. Nos. 4,623,804 and 4,092,553, and in the following articles: K. Likharev, et al. "RSFQ logic/memory family: a new Josephson-junction technology for sub-terahertz-clock frequency digital systems," *IEEE Trans. Appl. Supercon*, Vol. 1, pp. 3–28, March 1991; O. Mukhanov, et al., "New elements of the RSFQ logic family," *IEEE Trans. Magn.*, Vol. 27, pp. 2435–2438, March 1991; and S. Polonsky, et al., "New RSFQ circuits," *IEEE Trans. Appl. Supercon*, Vol. 3, pp. 2566–2577, March 1993.

Superconductor logic circuits are known to operate in constant current mode. In particular, a bias current is provided which maintains the operating point of the Josephson junctions in the circuit that is fixed at predetermined values for each circuit. Both AC and DC operated circuits are known. For example, U.S. Pat. No. 4,092,553 is an example of an AC operated logic circuit while Likharev, Mukhanov, and Polonsky (Ref. 1–3, respectively) describe DC operated logic circuits. Such current mode logic circuits are sourced by an individual resistor R in series with a power supply. The resistor is known to be selected to be large enough to maintain a voltage $V_R = IR$ that is sufficiently larger than the maximum voltage developed across the Josephson junctions in order to keep the current constant and provide isolation from other circuits. This results in extra power dissipation $I \times V_R$. The current in the resistor R is equal to the current in the active circuit. As such, the power dissipated in the resistor is least five to ten times larger than the power dissipated in the switching circuit. Thus, there is a need to provide a superconducting logic circuit with reduced power dissipation. A second important need is to enable logic operation of large digital circuits at much higher clock rates, exceeding 10 GHz and approaching 100 GHz or higher. Clock rates are presently limited by clock distribution and regeneration jitter and by circuit complexity.

SUMMARY OF THE INVENTION

Briefly, the present invention relates to a superconducting self-clocked complementary logic family. In particular, the invention describes a new class of single flux quantum (SFQ) circuits and devices. The basic element of the circuit is a plurality of Josephson junctions and a control inductance coupled across a pair of voltage rails. An important aspect of the invention relates to the use of voltage biasing for the Josephson junctions, which provides several benefits. First, voltage biasing eliminates the need for large biasing resistors as used in constant current mode devices. Such biasing resistors are known to be the dominant source of power dissipation in such logic circuits. Elimination of the biasing resistors thus reduces the power dissipation to the lowest possible value of the power dissipation of the switching devices themselves. In addition, the voltage biasing takes advantage of the voltage to frequency relationship of Josephson junctions and automatically establishes a global clock at the Josephson frequency without the need for extra circuitry; thus increasing the practical clock rate. The superconducting digital logic family in accordance with the present invention includes devices which perform logic functions such as, AND, OR etc. as well as non-logic functions, such as a shift register function.

BRIEF DESCRIPTION OF THE DRAWINGS

These and other advantages of the present invention are readily understood with reference to the following specification and attached drawing wherein:

FIG. 7a is a schematic diagram of an AND gate in accordance with the present invention.

FIG. 7b is a schematic diagram of an OR gate in accordance with the present invention.

FIG. 8a is a schematic diagram of NOT gate in accordance with the present invention.

FIG. 8b is a schematic diagram of HALF-XOR gate in accordance with present invention.

FIG. 8c is a truth table for the HALF-XOR gate illustrated in FIG. 11.

DETAILED DESCRIPTION

The present invention relates to a superconducting logic family with reduced power operation and a higher operating speed relative to known superconductor logic families. In accordance with an important aspect of the present invention, the superconducting logic circuits are operated in a voltage bias mode which eliminates the need for bias resistors which significantly reduces the power dissipation of such devices. The voltage bias automatically provides a global clock based on the Josephson frequency to voltage relationship to automatically provide self-clocking of all gates in the device without the need for any clocking circuitry. As is known in the art, a linear relationship exists between the voltage and frequency of Josephson junctions. More particularly, Josephson junctions which are voltage biased oscillate and emit single flux quantum (SFQ) pulses at the rate $f = V/\phi_0$, where $\phi_0$ is the magnetic flux quantum equal to the ratio $h/2e$, where h is Planck's constant and e is the electronic charge. The magnitude of the frequency is approximately 486 MHz/$\mu$V. Therefore, if a voltage bias is applied to the device, the current will oscillate at a fundamental frequency 486 MHz/μV, thereby providing an internally generated frequency which serves as a clock for all logic operations.

In accordance with one aspect of the present invention, all gates are coupled to the same pair of voltage rails; each rail consisting of a superconducting line. By coupling each of the Josephson gates to the same rails, this insures that all of the Josephson gates are biased at the same voltage and hence self-clocked synchronously at the same frequency.

Another aspect of the invention is that each gate is configured as a complementary pair of series-connected Josephson junctions, similar to CMOS logic, forming superconducting quantum interference devices (SQUIDs). Such SQUIDs include two or more Josephson junctions and at least one control inductor. In such SQUID devices, data is stored as a magnetic flux quantum in the control inductor. Data is transmitted between the Josephson junctions by a current pulse resulting from SFQ transitions of logic operations.

Figure 1:
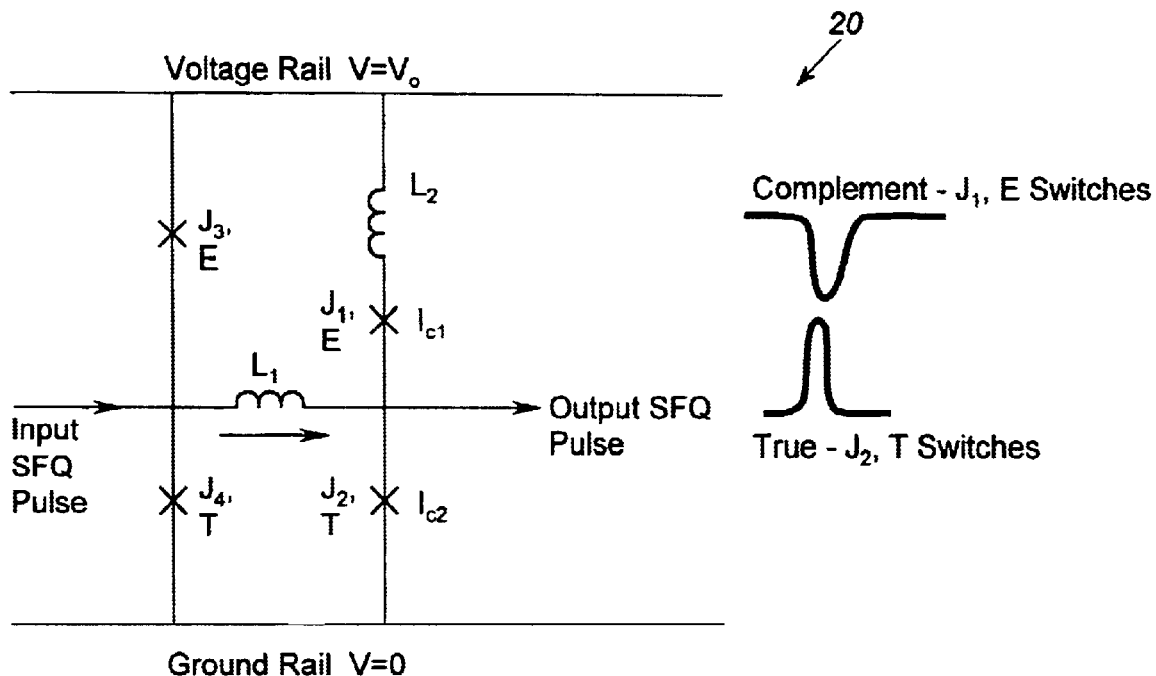
FIG. 1 is a schematic diagram of a basic single flux quantum (SFQ) logic circuit in accordance with the present invention.

A basic element of the logic family in accordance with the present invention is illustrated in FIG. 1 and generally identified with the reference numeral 20. The basic element 20 includes a pair of series connected, damped Josephson junctions $J_1$ and $J_2$ and control inductor $L_1$. Also shown is a parallel pair of Josephson junction $J_3$ and $J_4$ for generating SFQ pulses at the Josephson frequency which are applied to the control inductor $L_1$. The gate 20 is powered by global V=0 and V=$V_0$ rails. As will be discussed in more detail below, an additional inductor $L_2$ may be placed in series with the Josephson junctions $J_1$ and $J_2$ to ensure synchronous operation of all of the Josephson junctions in the circuit 20.

As mentioned above, the gate 20 utilizes a pair of damped Josephson junctions $J_1$ and $J_2$. In operation, the current rises in both junctions until it reaches the critical current of one junction, at which time that junction switches and diverts current equivalent to an SFQ pulse. This current pulse is accompanied by a decrease in the current in both junctions, at which time the cycle starts over.

Referring to FIG. 1, only one of the junctions E, T switches and emits an SFQ pulse while the other junction is relatively undisturbed during each clock cycle. The particular junction which switches depends on the circuit design and the data present at the time when the current switch occurs. In particular, data is stored as a current in the storage inductor $L_1$ and the presence/absence and direction of that current determines which junction switches. In operation, when the junction $J_2$ switches, the current is diverted to the right providing a logical 1 or true output. If the junction $J_1$ switches a negative current will flow in the output line providing a logical 0 or complementary output. This current is stored in the control inductor of the next gate. One and only one of the two complementary junctions $J_1$, $J_2$ emits a single flux quantum pulse every clock cycle.

As mentioned above, the circuit is powered by the global V=0 and V=$V_0$ voltage rails. The complementary junctions $J_1$, $J_2$ in the circuit 20 define a clock cycle given by the Josephson voltage to frequency relation. Multi-GHz global clock can thus be produced using an external DC power source.

Figure 2:
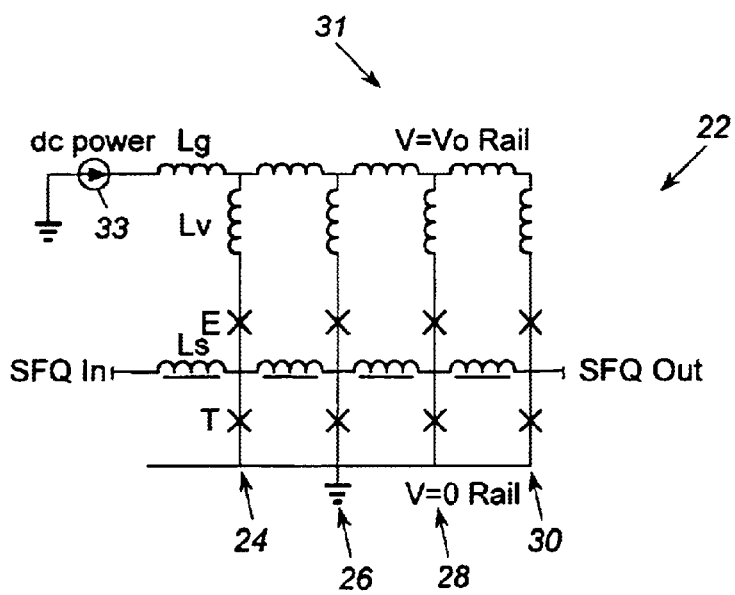
FIG. 2 is a schematic diagram of a basic shift register in accordance with the present invention developed from the SFQ logic circuit illustrated in FIG. 1.

A shift register in accordance with the present invention is illustrated in FIG. 2 and generally identified with the reference numeral 22. The shift register 22 may be formed from a plurality of basic elements 20, connected in cascade as shown, for example, forming four stages 24, 26, 28 and 30. Each shift register stage 24, 26, 28 and 30 includes a complementary pair of Josephson junctions, identified as transmission (T) and escape (E) junctions coupled in series and a control inductor $L_s$. The value of $L_s$ is large enough to hold a SFQ pulse (i.e. logical 1) until the clock shifts it out through the transmission junction T. If an SFQ current is not present in the storage loop (i.e. logical 0), the clock will switch the escape junction E. As such, an SFQ pulse at the input of the shift register will proceed toward the output at the rate of one stage per clock cycle.

Since the invention relies upon the self-clocked relationship of voltage biased Josephson junctions, one consideration is that all pairs of the Josephson junctions be subjected to the same voltage. As such, in one embodiment as shown in FIG. 2, the upper rail may be modeled as an inductor network generally identified with the reference numeral 31, which includes gate inductors $L_g$ and parasitic inductors $L_v$ per stage, powered from a single DC source 33.

Figure 3:
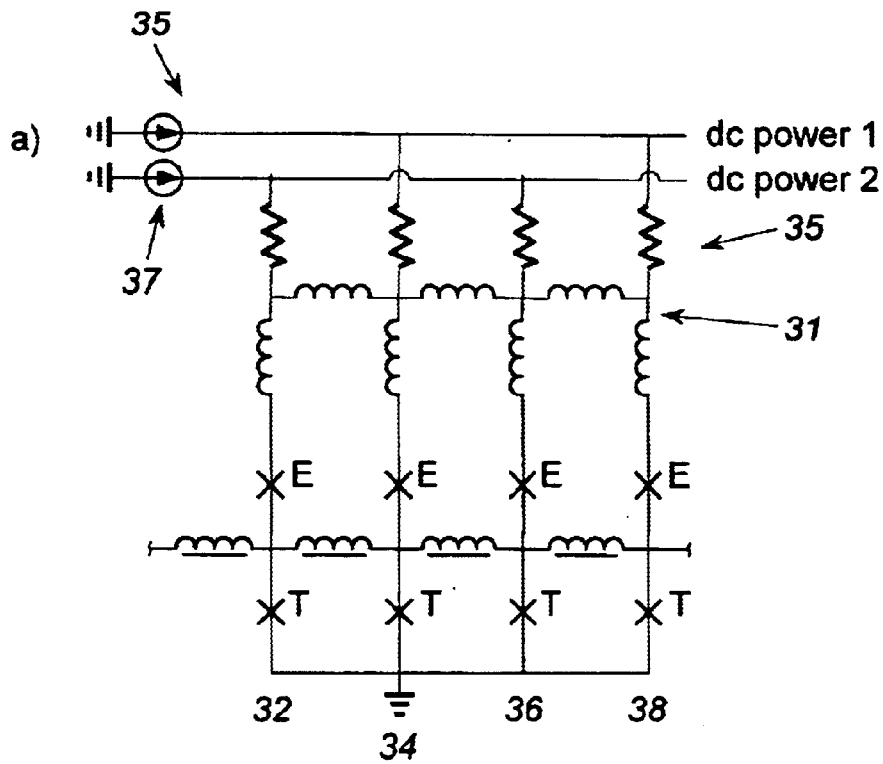
FIG. 3 is an alternate embodiment of the shift register illustrated in FIG. 2.

The inductor network 31, as implemented in FIG. 3, may constitute a current divider. Power may be more uniformly distributed to each node on the upper rail using a relatively low value resistor network, generally identified with the reference numeral 35, as illustrated in FIG. 3. The resistor network 35 produces equal phase conditions at each node. The resistor values may be selected to be as small a resistance as is practical in order that the DC voltage is the same at each node.

Another consideration with the present invention is that within a single clock cycle, data may shift two or more stages instead of the desired one stage if the delay between stages is comparable to the time resolution of the basic cell. In one embodiment, a two-phase clock may be used. In particular, odd stages of the shift register maybe clocked with phase 1 clock while even stages used the phase 2 clock. With such configuration, data is shifted to shift register stages within a single clock period. Thus, at any given time the data is either in the phase 1 stage or the phase 2 stage.

Two-phase clocking is illustrated in FIG. 3. As shown, two DC power sources 35, 37, identified as DC power 1 and DC power 2, are shown forming a phase 1 clock and phase 2 clock, respectively. Use of the phase 1 and phase 2 clocks as illustrated in FIG. 3 cause current to flow between adjacent stages in the upper rail and establishes a phase difference of π. Thus, the phase 1 clock is generated at even stages 34 and 38 of the shift register while the phase 2 clock is generated at the odd stages 32 and 36.

Figure 4:
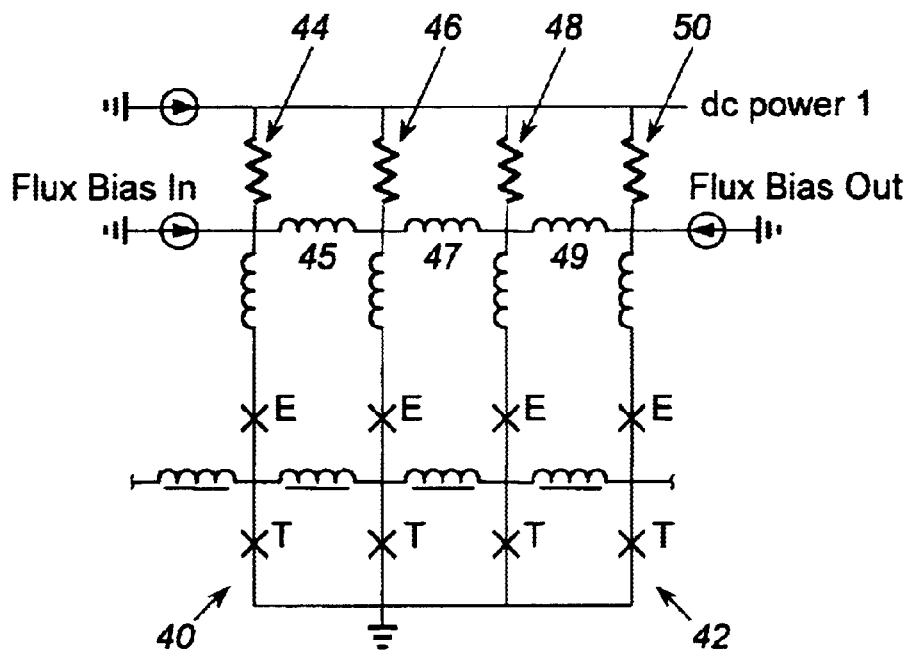
FIG. 4 is another alternate embodiment of the shift register illustrated in FIG. 2.

An alternative implementation of the power circuit is illustrated in FIG. 4. As shown in FIG. 4, two phase power is established by a "uniform" DC power 1 and a phase-shifting current labeled "flux bias." The uniform current is supplied through equal resistors 44, 46, 48, 50 and would produce a uniform single phase lock. However, introduction of the flux bias current in the upper rail (inductors 45, 47, 49) produces a one-half flux quantum bias between adjacent junction pairs. This translates to a π phase shift in the clock pulses, effecting a uniform two-phase clock.

Figure 5:
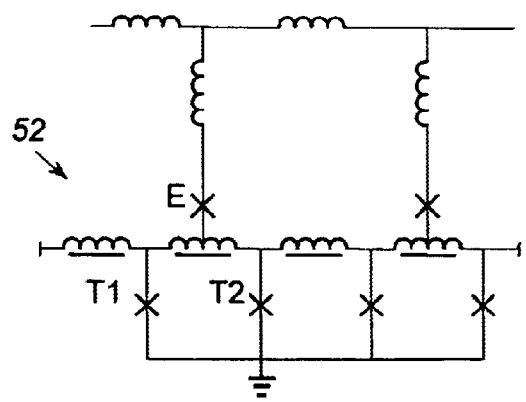
FIG. 5 is yet another alternate embodiment of the shift register illustrated in FIG. 2.

The timing of clock is data dependent. In particular, if no SFQ pulse is present in a shift register stage (i.e. logical 1), the escape junction E will switch at the given time within the clock period. If an SFQ pulse is present, extra current flows in the transmission junction T which will switch at an earlier time. In other words, the transmission junction T will beat the escape junction E to the switching event. As such, the comparator's switching event defines the clock timing. In order to resolve this problem, the shift resistor stage may be implemented as a three-junction circuit as shown in FIG. 5, incorporating two transmission junctions $T_1$ and $T_2$ and generally identified with the reference numeral 52. In this configuration, the transmission junction $T_1$ beats the escape junction E as described above. However, switching of second transmission junction $T_2$ lags the first. As such, clock generation is not complete until both transmission junctions $T_1$ and $T_2$ have switched. As such, the use of dual transmission junctions $T_1$ and $T_2$ reduces data dependence of the clock timing.

The internally generated clock may be synchronized to an external clock source. For example, in one implementation, an external source may be used to generate the clock by triggering a row of shift registered gates along one side of the circuit. In this implementation, the clock ripples across the shift register in a way analogous to an SFQ pulse propagation in a Josephson transmission line. As such, if the internally generated clock frequency is close to the desired frequency, phase locking to an internal source is relatively easily accomplished with a small amount of additional circuitry.

The basic shift register circuit or cell illustrated in FIG. 5 may be used to formulate various digital circuits in accordance with the present invention as discussed below. Such logic circuits share several features in common. In particular, the clock is generated within each gate in the complementary functions of the Josephson junctions. Logic consists of passing an SFQ pulse through the escape junction E (logical 0) or the transmission junction $T_1$, $T_2$ (logical 1) of the cell. Logic gates simply move an SFQ pulse from the transmission path $T_1$, $T_2$ to the escape path E or vice versa. Latency is one half cycle for the AND and OR operations, 1 clock cycle for the NOT and HALF XOR devices. Throughput of all the gates in operation is per clock cycle. Each gate has a fan out of at least two. The inductors at the input of each gate can be selected to store an SFQ pulse until the onset of the clock.

Figure 6:
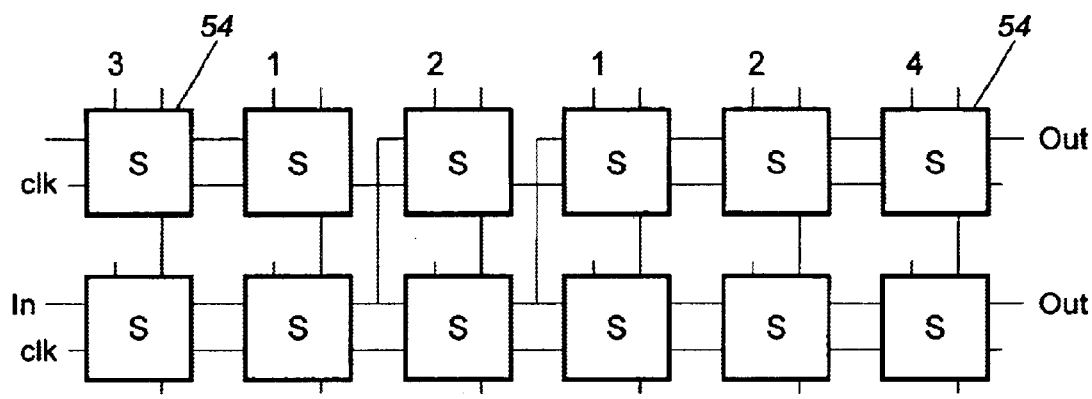
FIG. 6 is a block diagram of 2×6 shift register in accordance with the present invention.

Referring to FIG. 6, two six-stage shift registers arranged in parallel are illustrated, formed from a plurality of shift register cells 54. Although not shown the circuit is powered with a DC current source. A two-phase clock is generated in the circuit. Biasing of rows 1 and 2 produces a two-phase clock. This two-phase clock may be phase locked to an external, for example 20 GHz external source coupled to the $V=V_o$ voltage rail.

Other examples of self-clocked, complementary logic gates are shown in FIGS. 7a, 7b, 8a, and 8b. These are the AND/, OR, NOT, and HALF XOR. The truth table for the Half-XOR is given in FIG. 8c. These gates operate according to the principles laid out in Refs. Likharev, Mukhanov, and Polonsky, but have been reconfigured. Various other SFQ logic gates may be reconfigured for self-clocked, complementary logic, in the same way.

Figure 9:
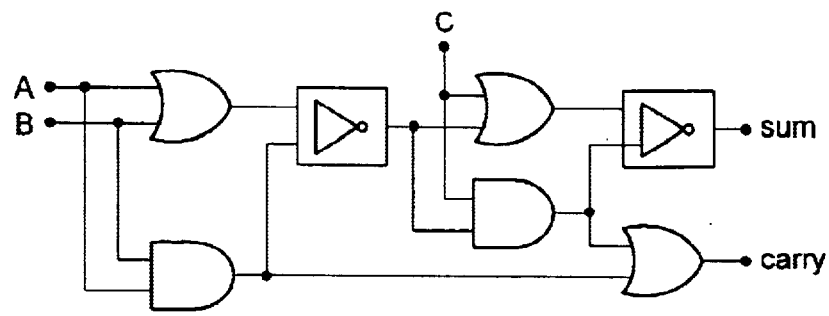
FIG. 9 is a logic diagram of a full adder in accordance with the present invention.
Figure 10:
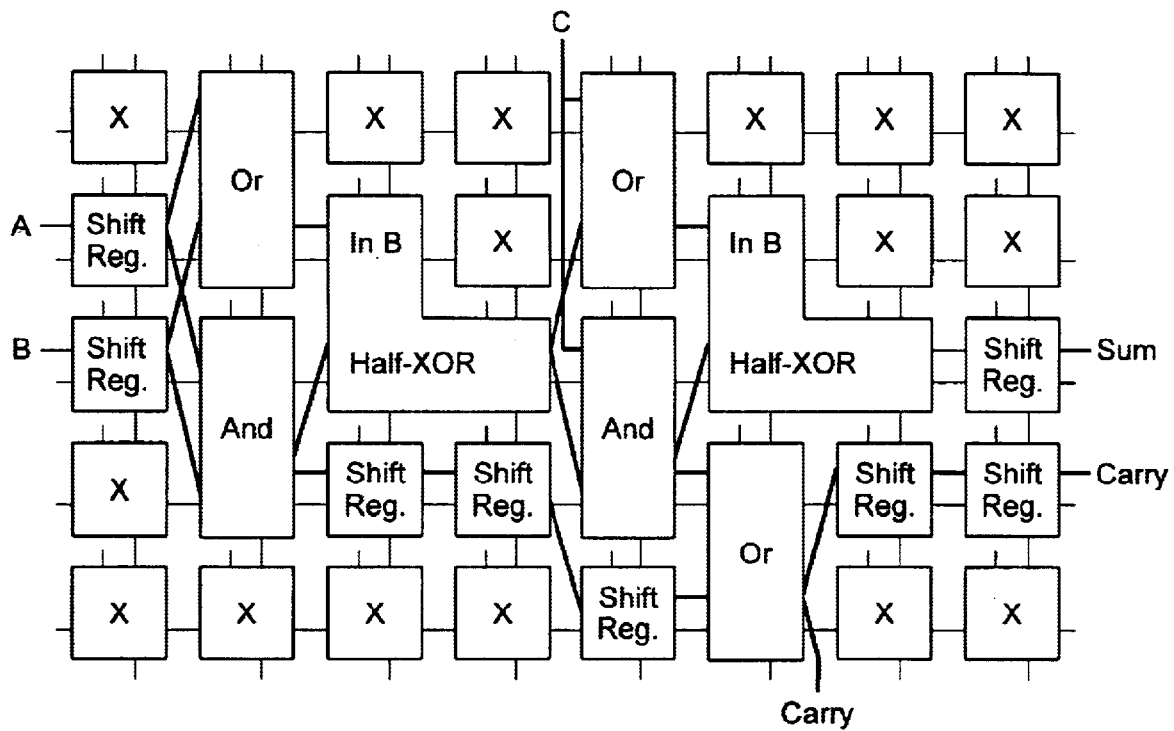
FIG. 10 is a block diagram of the full adder illustrated in FIG. 9.
Figure 11:
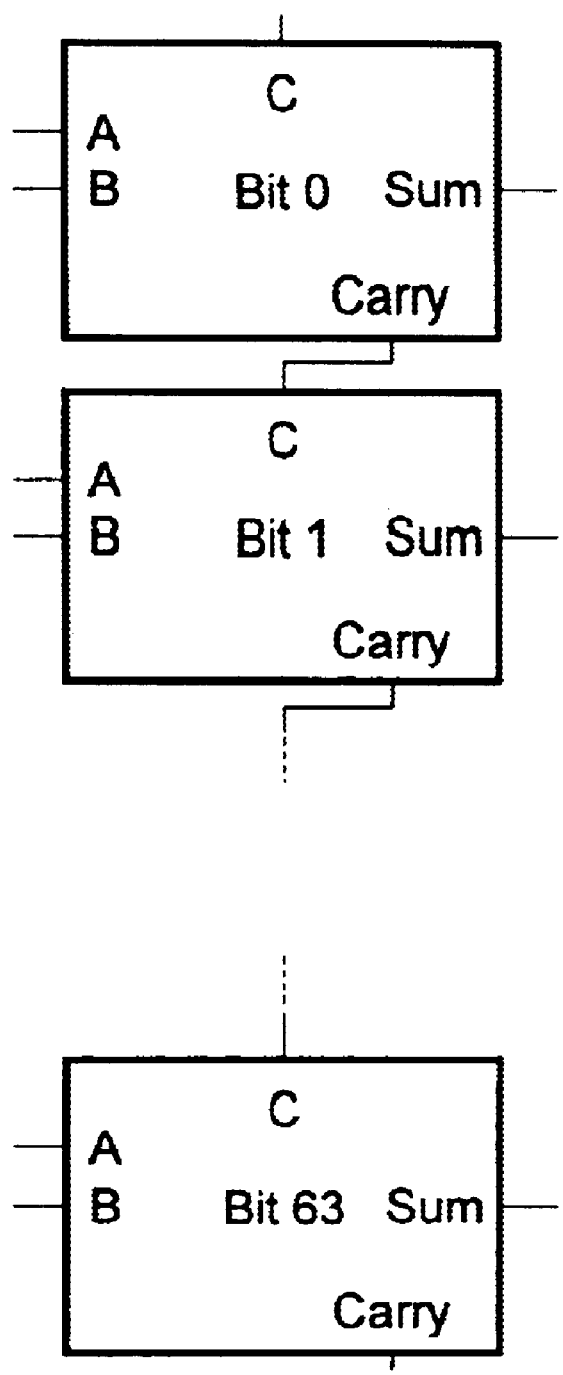
FIG. 11 is block diagram of a 64 integer adder using a full adder in accordance with the present invention.

FIGS. 9–11 illustrate a 1-bit full adder using the AND, OR and HALF XOR gates discussed above. In addition, the gate labeled "X" is simply a shift register gate with the input and output unwired. The carry output of one gate and the C input of the next gate are of different clock phases as required. The carry signal ripples through the array from the least significant bit to the most significant bit requiring one clock cycle per bit. Subsequent data inputs to each full adder are therefore delayed a clock cycle. Latency of a one bit single full adder is four clock cycles. Each additional bit of the integer adder adds one cycle. Latency of the 64-bit adder is 67 cycles. Throughput is one operation per clock cycle.

Obviously, many modifications and variations of the present invention are possible in light of the above teachings. Thus, it is to be understood that, within the scope of the appended claims, the invention may be practiced otherwise than as specifically described above.

We claim:

1. A superconducting logic circuit comprising:
   one or more pairs of serially coupled Josephson junctions, each pair defining a node therebetween, each of said one or more pairs of said serially coupled Josephson junctions coupled a biasing source; and
   one or more control inductors coupled between said nodes defining a logic cell, said logic cell configured to perform a predetermined logic function; and
   a biasing source for biasing said Josephson junctions, said biasing source configured to cause said Josephson junction to be voltage biased.

2. The superconducting logic circuit as recited in claim 1, wherein said predetermined logic function is a shift register.

3. The superconducting logic circuit as recited in claim 1, wherein said predetermined logic function is an AND gate.

4. The superconducting logic circuit as recited in claim 1, wherein said predetermined logic function is an OR gate.

5. The superconducting logic circuit as recited in claim 1, wherein said predetermined logic function is a NOT gate.

6. The superconducting logic circuit as recited in claim 1, wherein said predetermined logic function is a HALF XOR gate.

7. The superconducting logic circuit as recited in claim 1, wherein said predetermined logic function is an integer adder.

8. The superconducting logic circuit as recited in claim 1 further including an inductor network and a DC current source for powering one rail of said pair of voltage rails.

9. The superconducting logic circuit as recited in claim 1 further including a pair of DC current sources and a resistor network; configured such that one DC current source powers some of the stages and the other DC current source powers the balance of the stages.

10. The superconducting logic circuit as recited in claim 1, wherein said plurality of Josephson junctions is two.

11. The superconducting logic circuit is recited in claim 1, wherein said plurality of Josephson junctions is three.

* * * * *

UNITED STATES PATENT AND TRADEMARK OFFICE
CERTIFICATE OF CORRECTION

PATENT NO. : 6,734,699 B1
DATED : May 11, 2004
INVENTOR(S) : Quentin P. Herr and Arnold H. Silver Page 1 of 1

It is certified that error appears in the above-identified patent and that said Letters Patent is hereby corrected as shown below:

Column 6,
Lines 20-21, should read as follows:
-- one or more pairs of said serially coupled Josephson junctions coupled to a common biasing source; and --
Lines 23-27, should read as follows:
-- defining a logic cell, said logic cell configured to perform a predetermined logic function, said biasing source configured to cause said Josephson junction to be voltage biased. --

Signed and Sealed this

Twenty-second Day of February, 2005

JON W. DUDAS
*Director of the United States Patent and Trademark Office*